United States Patent
Cho

(10) Patent No.: US 7,560,770 B2
(45) Date of Patent: Jul. 14, 2009

(54) MOSFET DEVICE SUPPRESSING ELECTRICAL COUPLING BETWEEN ADJOINING RECESS GATES AND METHOD FOR MANUFACTURING THE SAME

(75) Inventor: Gyu-Seog Cho, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/757,327

(22) Filed: Jun. 1, 2007

(65) Prior Publication Data

US 2008/0048252 A1 Feb. 28, 2008

(30) Foreign Application Priority Data

Aug. 25, 2006 (KR) .................. 10-2006-0081274

(51) Int. Cl.
  *H01L 29/94* (2006.01)
(52) U.S. Cl. .................. 257/330; 257/404; 438/270; 438/279
(58) Field of Classification Search .................. 257/330, 257/404, 396, 401, E21.428, E21.429, E29.267; 438/270, 279, 286
See application file for complete search history.

(56) References Cited

U.S. PATENT DOCUMENTS

2006/0118889 A1* 6/2006 Suh .................. 257/404

FOREIGN PATENT DOCUMENTS

| KR | 1020000013572 A | 3/2000 |
| KR | 1020000054995 A | 9/2000 |

* cited by examiner

*Primary Examiner*—N Drew Richards
*Assistant Examiner*—Paul E Patton
(74) *Attorney, Agent, or Firm*—Townsend and Townsend and Crew LLP

(57) ABSTRACT

A MOSFET device comprises a semiconductor substrate having a gate area, a storage node contact area and a bit line contact area. A first groove is defined at a first depth in the gate area and a second groove is defined at a second depth in the bit line contact area. A recess gate is formed in the gate area of the semiconductor substrate including the first groove. A first junction area is formed in the storage node contact area of the semiconductor substrate. A second junction area is formed in the bit line contact area of the semiconductor substrate under the second groove.

8 Claims, 4 Drawing Sheets

US 7,560,770 B2

MOSFET DEVICE SUPPRESSING ELECTRICAL COUPLING BETWEEN ADJOINING RECESS GATES AND METHOD FOR MANUFACTURING THE SAME

CROSS-REFERENCE TO RELATED APPLICATION

The present application claims priority to Korean patent application number 10-2006-0081274 filed on Aug. 25, 2006, which is incorporated herein by reference in its entirety.

BACKGROUND OF THE INVENTION

The present invention relates to a MOSFET device and a method for manufacturing the same, and more particularly, to a MOSFET device which suppresses electrical coupling between adjoining recess gates and a method for manufacturing the same.

As a semiconductor device becomes more highly integrated, the channel length of a transistor decreases. Therefore, when attaining the target threshold voltage of a MOSFET device, limitations necessarily exist in a conventional planar type transistor structure.

In order to overcome the problems caused by the short channel length, a MOSFET device having a three-dimensional gate (e.g., a recess gate) has been developed.

FIG. 1 is a cross-sectional view illustrating a conventional MOSFET device. Referring to FIG. 1, a groove H delimiting a gate area is defined by forming a recess in a semiconductor substrate 100 having an isolation structure 110. A recess gate 130, which includes a gate insulation layer 132, a gate conductive layer 134 and a gate hard mask layer 136, is formed in the groove H. Junction areas 150 are formed in the semiconductor substrate 100 on both sides of the recess gate 130.

In the MOSFET device having the recess gate structure described above, the recessed portion of the semiconductor substrate increases the channel length relative to a planar type MOSFET device.

However, in the MOSFET device having the recess gate structure, the channel length of a transistor is increased by defining a groove. The groove is defined by etching the semiconductor substrate. As a result, the distance between adjoining recess gates is shortened due to the structural characteristic of the groove.

Therefore, as the distance between adjoining recess gates is decreased, electrical coupling occurs between adjoining recess gates. Thus, electric fields of the adjoining recess gates interact with each other. As a result, the threshold voltage of a cell decreases by the voltage applied to an adjoining recess gate.

In the MOSFET device having the conventional recess gate structure, an effective channel length can be increased relative to the planar type MOSFET device. However, due to the electrical coupling between adjoining recess gates caused by the structural characteristic of the groove, current leakage results and the refresh characteristic of a semiconductor device is degraded.

SUMMARY OF THE INVENTION

An embodiment of the present invention is directed to a MOSFET device which suppresses electrical coupling between adjoining recess gates and a method for manufacturing the same.

In one embodiment, a MOSFET device comprises a semiconductor substrate having a gate area, a storage node contact area and a bit line contact area. A first groove is defined at a first depth in the gate area, and a second groove is defined at a second depth in the bit line contact area. A recess gate is formed in the gate area of the semiconductor substrate including the first groove. A first junction area is formed in the storage node contact area of the semiconductor substrate. A second junction area is formed in the bit line contact area of the semiconductor substrate under the second groove.

The first depth is larger than the second depth.

The first depth is substantially equal to a sum of the second depth and a depth of the second junction area.

The second depth ranges from approximately 200 Å to approximately 1,000 Å.

In another embodiment, a method for manufacturing a MOSFET device comprises defining a first groove at a first depth by etching a gate area of a semiconductor substrate. The semiconductor substrate includes the gate area, a storage node contact area and a bit line contact area. A recess gate is formed in the gate area of the semiconductor substrate including the first groove. A second groove is defined at a second depth by etching the bit line contact area of the semiconductor substrate. A first junction area is formed in the storage node contact area of the semiconductor substrate. A second junction area is formed in the bit line contact area of the semiconductor substrate under the second groove.

The first depth is larger than the second depth.

The first depth is substantially equal to a sum depth of the second depth and a depth of the second junction area.

The second depth ranges from approximately 200 Å to approximately 1,000 Å.

After defining the second groove and before forming the first and second junction areas, the method further comprises forming a screen oxide layer on the semiconductor substrate including the recess gate and the second groove.

The screen oxide layer is formed by an oxidation process.

DESCRIPTION OF SPECIFIC EMBODIMENT

In the present invention, a groove is defined in the bit line contact area of a semiconductor substrate, and a junction area is formed in the semiconductor substrate under the groove. The junction area can be formed at a deep position. Thus, electrical isolation between adjoining recess gates can be maintained. As a consequence, electrical coupling between adjoining recess gates can be suppressed. Even when the voltage of an adjoining recess gate changes, the electric fields of two adjoining recess gates cannot interact with each other. Thus, the threshold voltage of a cell is prevented from being decreased due to the voltage of an adjoining recess gate.

When forming a MOSFET device having a recess gate structure in accordance with embodiments of the present invention, the distance between adjoining recess gates decreases but the electrical coupling between the adjoining recess gates is suppressed. Thus, the operational characteristic of a semiconductor device is improved.

Hereafter, a method for manufacturing a MOSFET device in accordance with an embodiment of the present invention will be described with reference to FIGS. 2A through 2E.

Figure 1:
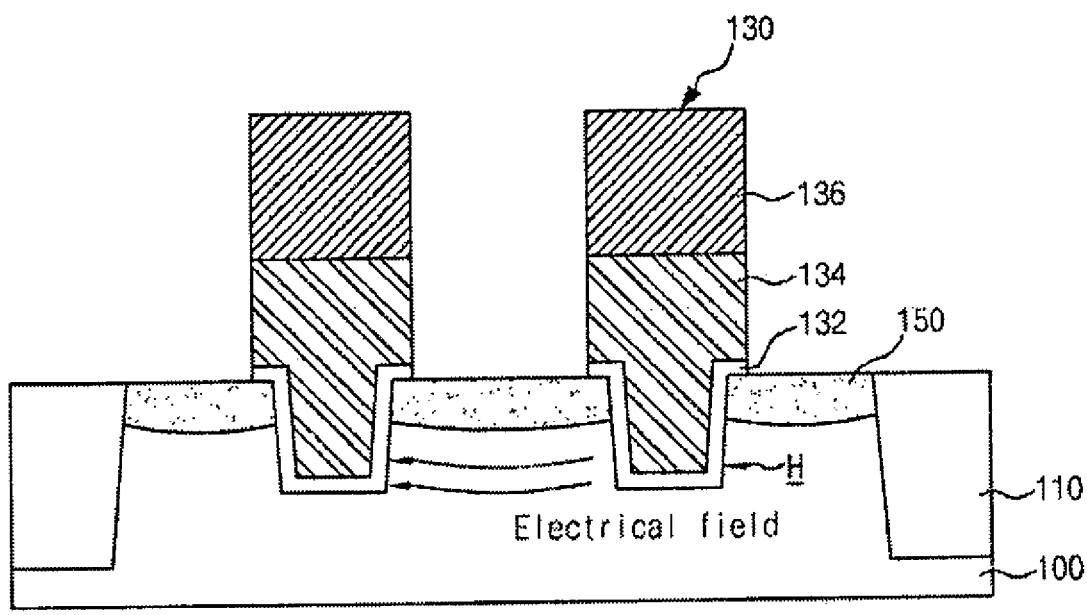
FIG. 1 is a cross-sectional view illustrating a conventional MOSFET device.
Figure 2A:
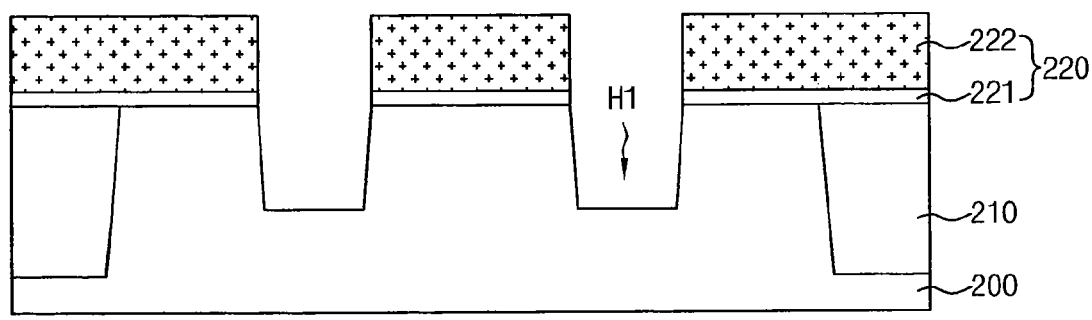
FIGS. 2A through 2E are cross-sectional views illustrating process steps of a method for manufacturing a MOSFET device in accordance with an embodiment of the present invention.

Referring to FIG. 2A, an isolation structure 210 is formed on a semiconductor substrate 200 which is divided into an active region having a gate area, a storage node contact area and a bit line contact area, and an isolation region. A hard mask pattern 220 is formed on the semiconductor substrate 200 including the isolation structure 210 to expose the gate area. The hard mask pattern 220 is formed as a stack of an oxide layer 221 and a polysilicon layer 222. A first groove H1 is defined at a first depth in the semiconductor substrate 200 by etching the exposed gate area of the semiconductor substrate 200 using the hard mask pattern 220 as an etch mask.

Figure 2B:
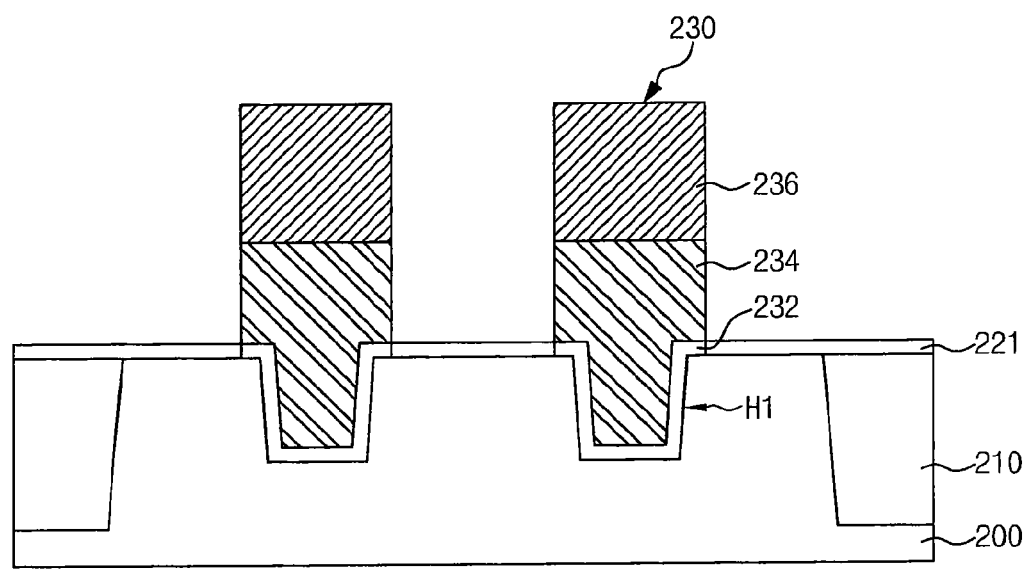

Referring to FIG. 2B, the polysilicon layer 222 of the hard mask pattern 220 is removed, and a gate insulation layer 232, a gate conductive layer 234 and a gate hard mask layer 236 are sequentially formed on the semiconductor substrate 200 including the first groove H1. The gate insulation layer 232 is formed as an oxide-based layer, the gate conductive layer 234 is formed as a stack of a polysilicon layer and a metal-based layer, and the gate hard mask layer 236 is formed as a nitride-based layer.

By etching the hard mask layer 236, the gate conductive layer 234 and the gate insulation layer 232, a recess gate 230 is formed in and over the first groove H1. In one embodiment, the recess gate 230 is formed to have a width which is greater than a width of the first groove H1.

Figure 2C:
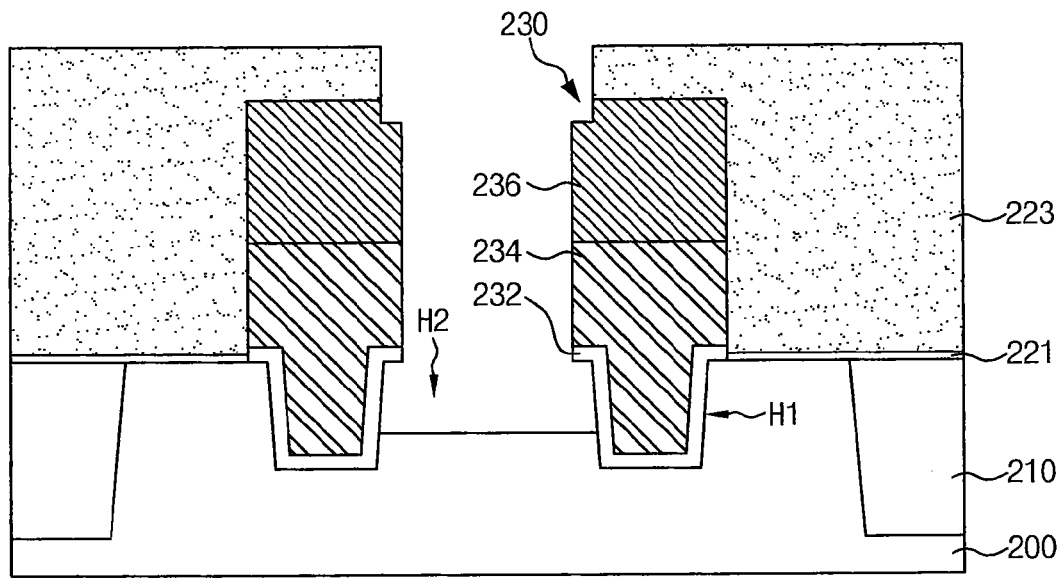

Referring to FIG. 2C, a photoresist pattern 223 is formed on the semiconductor substrate 200 including the recess gate 230 to expose the bit line contact area of the semiconductor substrate 200. By etching the exposed bit line contact area of the semiconductor substrate 200 using the photoresist pattern 223 as an etch mask, a second groove H2 of a second depth is defined. The second groove H2 is defined to have a depth which is less than a depth of the first groove H1. Preferably, the second groove H2 has a depth ranging from approximately 200 Å to approximately 1,000 Å. When etching the bit line contact area of the semiconductor substrate 200, the upper surface of the gate hard mask layer 236 is partially etched.

Figure 2D:
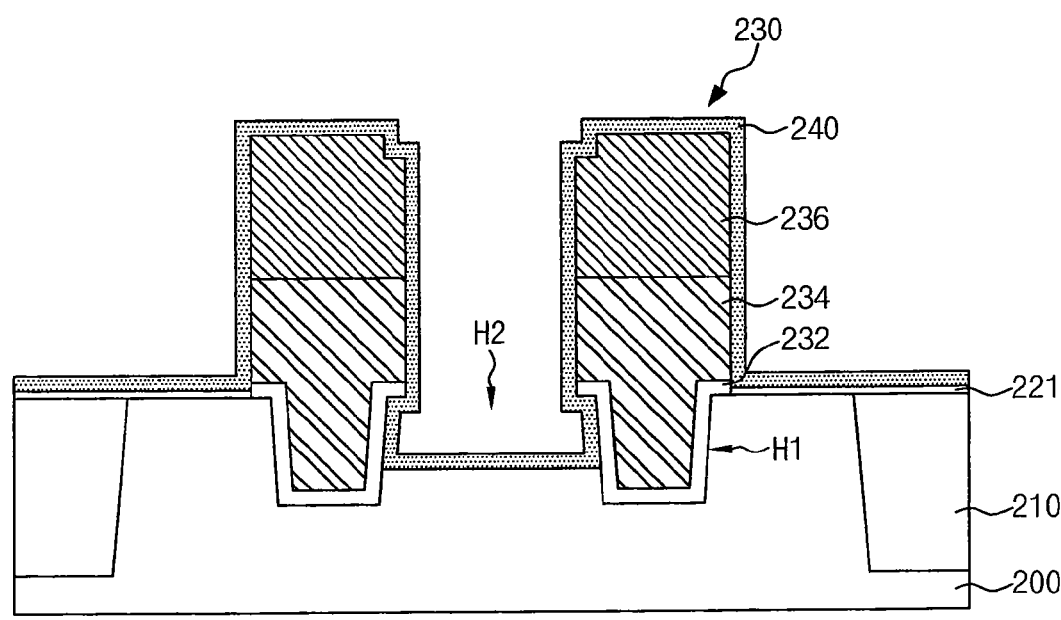

Referring to FIG. 2D, after removing the photoresist pattern 223, a screen oxide layer 240 is formed on the semiconductor substrate 200 including the recess gate 230 and the second groove H2. The screen oxide layer 240 is formed by conducting a light oxidation process on the semiconductor substrate 200 defined with the second groove H2.

Figure 2E:
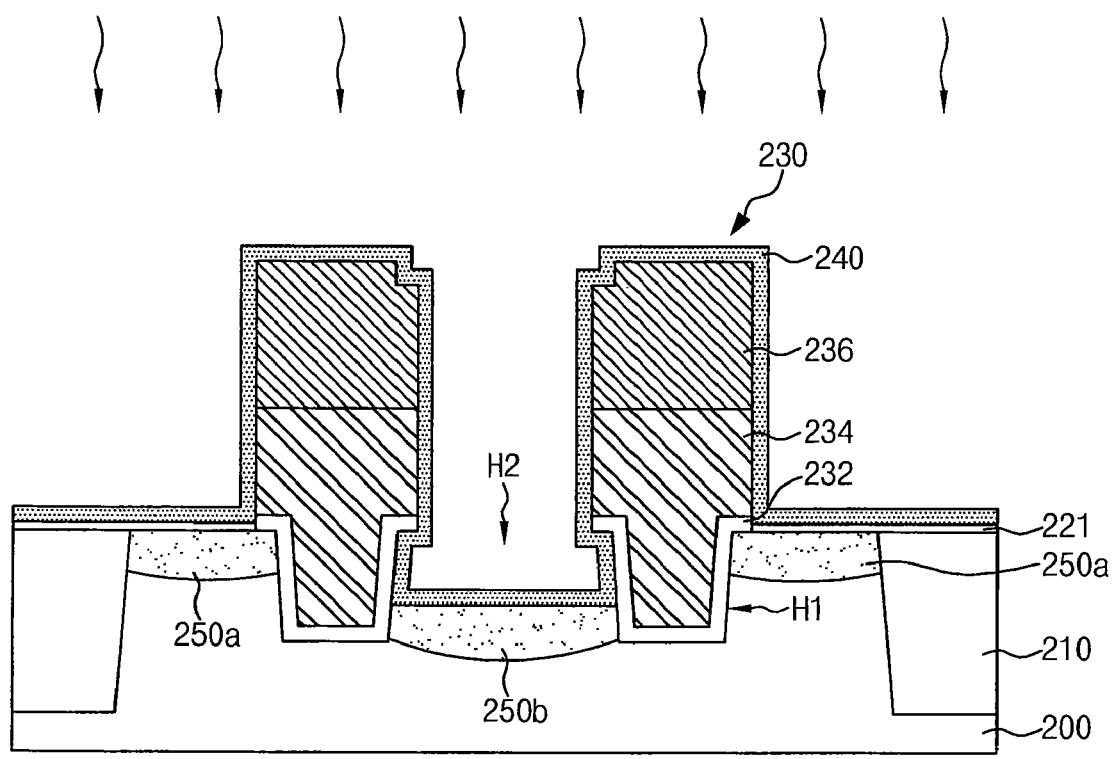

Referring to FIG. 2E, a highly doped impurity ion implantation process is conducted on the semiconductor substrate 200 formed with the screen oxide layer 240. The ion implantation process forms a first junction area 250a in the storage node contact area of the semiconductor substrate 200, and a second junction area 250b in the bit line contact area of the semiconductor substrate 200 under the second groove H2. A sum of the depth of the second groove H2 and a depth of the second junction area 250b is substantially equal to the depth of the first groove H1.

As is apparent from the above description, a second groove having a predetermined depth is defined by etching the bit line contact area of a semiconductor substrate and a junction area is formed in the surface of the semiconductor substrate under the second groove. The junction area can be formed at a deep position, such that electrical isolation between adjoining recess gates can be maintained.

Since electrical isolation between adjoining recess gates can be maintained, electrical coupling between adjoining recess gates is suppressed. Hence, even when the voltage of an adjoining recess gate changes, the electric fields of two adjoining recess gates cannot interact with each other. Thus, the threshold voltage of a cell is prevented from being decreased due to the voltage of the adjoining recess gate.

As a result, when forming a MOSFET device having a recess gate structure, even though the distance between adjoining recess gates decreases, electrical coupling between the adjoining recess gates is suppressed. Therefore, the operational characteristic of a semiconductor device is improved.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A MOSFET device comprising:
   a semiconductor substrate having a gate area, a storage node contact area and a bit line contact area, wherein a first groove is defined at a first depth in the gate area and a second groove is defined at a second depth in the bit line contact area;
   a recess gate formed in the gate area of the semiconductor substrate including the first groove;
   a first junction area formed in the storage node contact area of the semiconductor substrate; and
   a second junction area formed in the bit line contact area of the semiconductor substrate under the second groove,
   wherein the first depth is substantially equal to a sum of the second depth and a depth of the second junction area.

2. The MOSFET device according to claim 1, wherein the first depth is larger than the second depth.

3. The MOSFET device according to claim 1, wherein the second depth ranges from approximately 200 Å to approximately 1,000 Å.

4. A method for manufacturing a MOSFET device, the method comprising:
   defining a first groove of a first depth by etching a gate area of a semiconductor substrate, wherein the semiconductor substrate comprises the gate area, a storage node contact area and a bit line contact area;
   forming a recess gate in the gate area of the semiconductor substrate including the first groove;
   defining a second groove of a second depth by etching the bit line contact area of the semiconductor substrate; and
   forming a first junction area in the storage node contact area of the semiconductor substrate and a second junction area in the bit line contact area of the semiconductor substrate under the second groove,
   wherein the first depth is substantially equal to a sum of the second depth and a depth of the second junction area.

5. The method according to claim 4, wherein the first depth is larger than the second depth.

6. The method according to claim 4, wherein the second depth ranges from approximately 200 Å to approximately 1,000 Å.

7. The method according to claim 4, wherein, after defining the second groove and before forming the first and second junction areas, the method further comprises:
   forming a screen oxide layer on the semiconductor substrate including the recess gate and the second groove.

8. The method according to claim 7, wherein the screen oxide layer is formed by an oxidation process.

* * * * *